United States Patent [19]

Brower

[11] Patent Number: 4,690,637

[45] Date of Patent: Sep. 1, 1987

[54] SIDE-MOUNTED FLASHLAMPS

[75] Inventor: Boyd G. Brower, Willamsport, Pa.

[73] Assignee: GTE Products Corporation, Danvers, Mass.

[21] Appl. No.: 831,227

[22] Filed: Feb. 19, 1986

Related U.S. Application Data

[63] Continuation-in-part of Ser. No. 708,928, Mar. 6, 1985, abandoned.

[51] Int. Cl.⁴ .............................................. G03B 15/02
[52] U.S. Cl. ........................................ 431/359; 362/11; 362/16; 362/3
[58] Field of Search ............... 431/357, 358, 359, 360, 431/362, 365; 362/4, 6, 11, 13, 15, 16, 17, 339

[56] References Cited

U.S. PATENT DOCUMENTS

| | | | |
|---|---|---|---|
| 3,454,756 | 7/1969 | Iwata et al. | 431/358 |
| 3,473,880 | 10/1969 | Wich | 431/365 |
| 3,544,251 | 12/1970 | Brandt | 431/359 |
| 3,552,896 | 1/1971 | Kuhlmann | 431/359 |
| 3,956,625 | 5/1976 | Anderson | 431/359 |
| 3,990,832 | 11/1976 | Smialek et al. | 431/359 |
| 4,017,728 | 4/1977 | Audesse et al. | 431/365 |
| 4,055,759 | 10/1977 | Bouchard et al. | 431/359 |
| 4,126,409 | 11/1978 | Bok et al. | 431/359 |
| 4,170,034 | 10/1979 | Brower | 362/13 |
| 4,234,906 | 11/1980 | Schlinder | 362/11 |
| 4,243,371 | 1/1981 | Kewley et al. | 431/359 |
| 4,245,280 | 1/1981 | Hartman | 431/359 |
| 4,268,891 | 5/1981 | Brower et al. | 362/11 |
| 4,290,747 | 9/1981 | Collins | 431/359 |
| 4,290,748 | 9/1981 | Collin et al. | 431/359 |
| 4,329,734 | 5/1982 | Latos | 431/358 |
| 4,330,821 | 5/1982 | Brower et al. | 431/359 |
| 4,334,262 | 6/1982 | Latos | 362/11 |
| 4,424,020 | 1/1984 | Bouchard et al. | 431/362 |
| 4,435,156 | 3/1984 | Brower | 431/359 |
| 4,459,102 | 7/1984 | Brower | 431/359 |
| 4,462,063 | 7/1984 | English | 431/365 |
| 4,470,801 | 9/1984 | Broadt | 431/359 |
| 4,581,682 | 4/1986 | Shafter | 431/359 |

Primary Examiner—Samuel Scott
Assistant Examiner—H. A. Odar
Attorney, Agent, or Firm—Martha Ann Finnegan; Thomas H. Buffton

[57] ABSTRACT

A miniaturized multilamp photoflash array includes a printed circuit board with a common circuit extending along one edge and a plurality of contact pads along an opposite edge and a plurality of flashlamps mounted in a direction normal to the edges of the circuit board.

9 Claims, 2 Drawing Figures

SIDE-MOUNTED FLASHLAMPS

CROSS REFERENCE TO RELATED PATENT APPLICATION

This Application is a continuation-in-part of copending application Ser. No. 708928, filed on Mar. 6, 1985, now abandoned.

TECHNICAL FIELD

This invention relates to miniaturized multilamp photoflash arrays and more particularly to miniaturized multilamp photoflash arrays having a plurality of flashlamps mounted in a direction normal to the longitudinal axis of the array.

BACKGROUND ART

At the present time, all of the known forms of multilamp photoflash arrays either pass lead wires for the flashlamps through holes in a circuit board having a printed circuit thereon or has the lead wires of the flashlamps forced into the surface of the printed circuit boad. In the first instance, shrinkage or failures are encountered due to misalignment of the holes and lead wires. In the second instance, the lead wires tend to become unfastened from the printed circuit board causing undesired failures.

OBJECTS AND SUMMARY OF THE INVENTION

An object of the present invention is to overcome the deficiencies of the prior art. Another object of the invention is to provide an improved multilamp photoflash array. Still another object of the invention is to provide an enhanced multilamp photoflash array having a width dimension dependent upon the length of the flashlamps. A further object of the invention is to provide a multilamp photoflash array with side mounted flashlamps.

These and other objects, advantages and capabilities are achieved in one aspect of the invention by a multilamp photoflash array having a printed circuit board with a common electrical circuit extending along one edge of the board, a plurality of contact pads extending along an opposite edge of the board, a hot circuit formed for connection to every other contact pad, a plurality of flashlamps extending normal to the edges of the board with electrical leads bent over the edge and affixed to the contact pads, a plurality of normally-closed switches connecting the common and hot circuits, a plurality of normally-open switches connecting the hot circuit to a following flashlamp upon activation of a flashlamp and a base member and cover member enclosing the flashlamps and circuit board.

BEST MODE FOR CARRYING OUT THE INVENTION

Figures 1, 2:
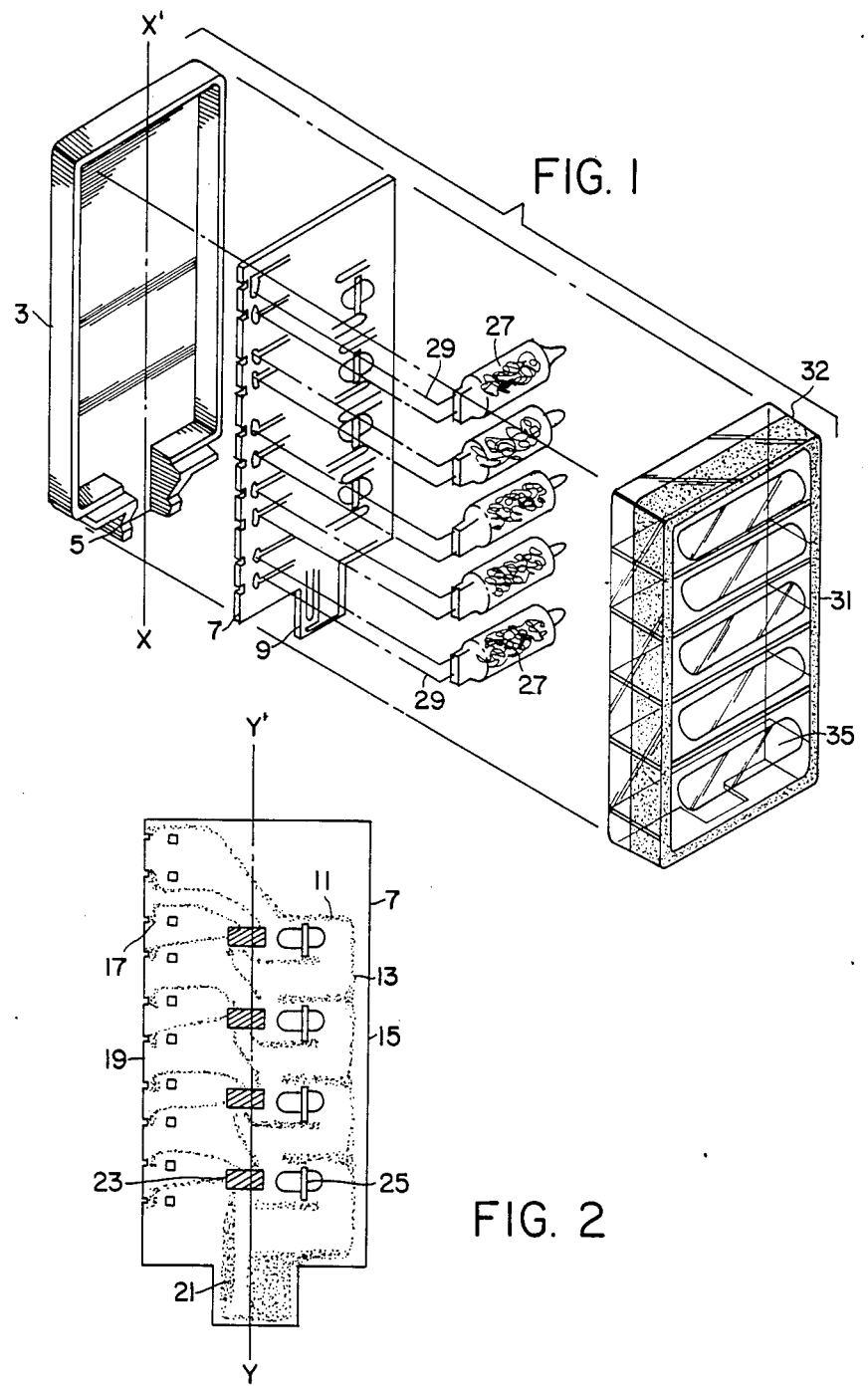
FIG. 1 is an exploded isometric view of a preferred embodiment of the invention.
FIG. 2 is a planned view of the printed circuit board and circuitry of the embodiment of FIG. 1.

For a better understanding of the present invention, together with other and further objects, advantages and capabilities thereof, reference is made to the following disclosure and appended claims in conjunction with the accompanying drawings.

Referring to the drawings, FIG. 1 illustrates a preferred form of miniaturized photoflash array. Therein, a plastic base member 3 having a longitudinal axis X—X' and an outwardly extending tab portion 5. The base member 3 is recessed and formed to receive a circuit board 7.

The circuit board 7 has a longitudinal axis Y—Y' similar to the longitudinal axis X—X' of the base member 3. Also, the circuit board 7 has an outwardly extending tab member 9 formed to fit within the tab portion 5 of the base member 3. Positioned on the surface of the circuit board 7 is an electrically conductive printed circuit 11. The printed circuit 11 includes an electrically conductive common, or ground, circuit 13 which extends from the tab portion 5 along one edge 15 of the circuit board 7 and in a direction substantially parallel to the longitudinal axis Y—Y'. A plurality of spaced contact pads 17 are aligned along an opposite edge 19 of the circuit board 7 and in a direction substantially parallel to the longitudinal axis Y—Y. Also, an electrically conductive hot circuit 21 extending from the tab member 9 is formed for connection to a plurality of the contact pads 17.

Attached to the printed circuit 11, best illustrated in FIG. 2, are a plurality of normally-open (N/O) switches 23 and a plurality of normally-closed (N/C) switches 25. The normally-open (N/O) switches 23 are formed to provide an electrically conductive path for the hot circuit 21 from one pair of contact pads 17 to the next pair of contact pads upon energization of the N/O switch 23 by energization of a flashlamp. Also, the normally-closed (N/C) switches 25 are formed to connect the electrically conductive common circuit 13 to a contact pad 17 prior to energization of a flashlamp and to disconnect the contact pad 17 from the common circuit upon energization of the flashlamp. Preferably, the N/C and N/O switches used in the present invention are radiation-responsive switches, although other types of switches, e.g., heat-activated or voltage-responsive switches can also be used.

A plurality of flashlamps 27, each having a pair of electrical leads 29, are aligned in a linear array along the longitudinal axis of the circuit board 7. The electrical leads, which extend from the ends of the flashlamps, are bent over the opposite edge 19 of the circuit board 7 to connect the leads to the contact pads 17. Preferably, a plurality of apertures are located in the circuit board 7 and aligned in a linear array parallel to the longitudinal axis of the board, one aperture being adjacent to each contact pad 17. After the leads 29 are bent over the opposite edge of the board 19, at least one lead of each electrical lead pair is preferably crimped into such apertures to secure the flashlamps to the circuit board 7. As used herein "crimping" includes frictionally inserting a looped, or u-shaped, portion of the lead wire into the aperture adjacent the contact pad to which the lead is connected. Most preferably, the two wires of each lead pair are secured to the circuit board by crimping.

In the photoflash array of the present invention, the flashlamps 27 are mounted such that each flashlamp 27 extends in a direction normal to the longitudinal axis Y—Y' of the circuit board 7. Thus, the dimension of the circuit board in a direction normal to the longitudinal axis Y—Y' is dependent upon the length of the flashlamps 27. Moreover, the flashlamps 27 are mounted without the need for passing the electrical leads through apertures in the circuit board 7 and in a manner such that the leads 29 are easily arrayed along the edge 19 of the circuit board 7.

Enclosing the circuit board 7 and the flashlamps 27 is a transparent plastic cover member 31 which is attached to the base member 3. The cover member 31 includes a frosted portion 33 and a curved lens 35 for each one of the flashlamps 27. This curved lens 35 tends to direct the light obtained upon energization of each of the flashlamps 27.

As to operation, it can be seen that "N"-flashlamps 27 (N equals the total number of flashlamps in the array) are operable with N−1 normally-open (N/O) switches 23 and N−1 normally-closed (N/C) swithces 25. There is only one active lamp in a normally operating array at any time and that is the unflashed lamp closest to the tab end of the array (array tab).

The small contact on the array tab is the hot contact, or energizing lead. Upon activation of a flashlamp 27, the normally-open switch 23 becomes conductive whereupon the hot circuit 21 is electrically connected to a second pair of the contact pads 17 which are, in turn, connected to a second flashlamp 27. At the same time, a normally-closed switch 25 is activated whereupon the first pair of contact pads 17 is disconnected from the common circuit 13. Thus, as each one of the flashlamps 27 is energized, the normally-open switches 23 transfer the hot circuit 21 to a following flashlamp 27 while the normally-closed switch 25 disconnects the contact pads 17 associated with the expended flashlamp 27 from the common circuit 13. Accordingly, the employment of the normally-open switches 23 and normally-closed switches 25 allows the hot circuit 21 to connect to successive flashlamps 27 while the normally-closed switches 25 disconnect the common circuit 13 from an expended flashlamp 27.

The following example more particularly describes the operation of a photoflash array in accordance with the present invention. Upon activation of a flashlamp in a photoflash array having, for example, five flashlamps in which none of the flashlamps have been flashed, current passes through the hot contact, through the first unflashed lamp, i.e., the lamp closest to the array tab, and through the first normally-closed (N/C) switch, and back to the common, or ground, contact. The heat of the flashed lamp activates both of the switches connected with, and directly under the flashed lamp, i.e., the N/C switch is burned open and the normally-open (N/O) switch becomes a short circuit. The conversion of the normally-closed switch to an open position converts the contact common to the first and second lamps into a hot contact by the shorting of the normally-open switch. This now places the next, or second, unflashed lamp in the active mode.

The second activation pulse causes current to pass through the shorted N/O switch under the first flashed lamp, through the second lamp, through the second N/C switch, and back to the common contact. The third activation pulse causes the current to pass through the two activated N/O switches, through the third lamp of the array, through the third N/C switch, and back to the common contact. The fourth and fifth (last) lamps are flashed in a similar manner, with the exception that the fifth lamp does not have an N/C switch because it is the last lamp of the array. The photoflash array of the present invention allows the hot circuit 21 and the common circuit 13 to be positioned along the edges of the circuit board which facilitates side-mounting of the flashlamps 27.

The foregoing example is given to enable those skilled in this art to more clearly understand and practice the present invention. The example should not be considered as a limitation upon the scope of the invention but merely as being illustrative and representative thereof.

While there has been shown and described what is at present considered the preferred embodiments of the invention, it will be obvious to those skilled in the art that various changes and modifications may be made therein without departing from the invention as defined by the appended claims.

I claim:

1. In a miniaturized multilamp photoflash array having a base member formed to receive a circuit board having a longitudinal axis, a tab member and a printed circuit thereon, the improvement wherein said printed circuit is on a single surface of said circuit board and includes an electrically conductive circuit extending from said tab member along one edge of said circuit board and parallel to said longitudinal axis, a plurality of spaced contact pads extending along an opposite edge of said circuit board and parallel to said longitudinal axis, a hot circuit extending from said tab member, a plurality of normally-open (N/O) switches connecting said hot circuit to a following flashlamp upon activation of a flashlamp, a plurality of normally-closed (N/C) switches for connecting said common circuit to said hot circuit, a plurality of flashlamps each aligned normal to said longitudinal axis of said circuit board with a pair of leads connected to a pair of contact pads and extending over said opposite edge of said circuit board, and a light transparent cover member enclosing said flashlamps and printed circuit board and affixed to said base member.

2. The improvement of claim 1 wherein said normally-closed (N/C) switches are formed to disconnect a flashlamp from said common circuit upon energization of said flashlamp.

3. The improvement of claim 1 wherein is included N-flashlamps, N−1 normally-open (N/O) switches and N−1, normally-closed (N/C) switches.

4. The improvement of claim 1 wherein said light transparent cover member includes a lens portion associated with said plurality of flashlamps wherein each flashlamp is focused by a lens.

5. A miniaturized multilamp photoflash array comprising a circuit board having a longitudinal axis and a tab member with an electrically conductive printed circuit on a single surface of said circuit board, said printed circuit including an electrically conductive common circuit extending from said tab member and along one edge of said circuit board parallel to said longitudinal axis, a plurality of spaced contact pads extending along the opposite edge of said circuit board parallel to said longitudinal axis and an electrically conductive hot circuit extending from said tab member and formed for connection to every other one of said spaced contact pads;

a plurality of flashlamps extending in a direction normal to said longitudinal axis of said circuit board with each flashlamp having a pair of leads bent over said opposite edge of said circuit board and connected to a pair of adjacent contact pads;

a plurality of normally-closed (N/C) switches connecting said common circuit to said hot circuit for all but one of said plurality of flashlamps;

a plurality of normally-open (N/O) switches connecting said hot circuit to a following flashlamp upon activation of a flashlamp;

a base member formed to receive said circuit board; and a light transparent plastic cover member affixed to said base member and enclosing said flashlamps.

6. The miniaturized multilamp photoflash array of claim 5 wherein said array includes N-flashlamps, N−1 normally closed (N/C) switches and N−1 normally-open (N/O) swtiches.

7. The miniaturized multilamp photoflash array of claim 5 wherein said normally-open (N/O) switches respond to energization of a flashlamp to provide electrical connection of said hot circuit to a following flashlamp.

8. The miniaturized multilamp photoflash array of claim 5 wherein said normally-closed (N/C) switches respond to energization of a flashlamp to disconnect said flashlamp from said common circuit.

9. The miniaturized multilamp photoflash array of claim 5 wherein said light transparent cover member includes a lens associated with each one of said flashlamps.

* * * * *